US006759941B2

(12) United States Patent
Kari et al.

(10) Patent No.: US 6,759,941 B2
(45) Date of Patent: Jul. 6, 2004

(54) CIRCUIT FOR DETECTING ELECTRICAL SIGNALS AT A GIVEN FREQUENCY

(75) Inventors: Ahmed Kari, Aix-en-Provence (FR); Michel Bardouillet, Rousset (FR)

(73) Assignee: STMicroelectronics SA, Montrouge (FR)

( * ) Notice: Subject to any disclaimer, the term of this patent is extended or adjusted under 35 U.S.C. 154(b) by 496 days.

(21) Appl. No.: 09/837,629

(22) Filed: Apr. 18, 2001

(65) Prior Publication Data

US 2001/0038341 A1 Nov. 8, 2001

(30) Foreign Application Priority Data

Apr. 20, 2000 (FR) .............................................. 00 05105

(51) Int. Cl.[7] .................. G05B 19/00; G06F 7/00; G08B 29/00; H03D 1/00; H04L 27/06
(52) U.S. Cl. ........................................ 340/5.6; 375/340
(58) Field of Search ........................... 340/5.6; 375/340, 375/326, 316, 279

(56) References Cited

U.S. PATENT DOCUMENTS

| | | | |
|---|---|---|---|
| 3,737,789 A | | 6/1973 | McCoy et al. .............. 328/138 |
| 3,774,114 A | * | 11/1973 | Dahlgren ................... 340/7.33 |
| 4,442,500 A | | 4/1984 | Kongable et al. ........... 364/724 |
| 4,596,981 A | * | 6/1986 | Ueno et al. ............... 340/825.2 |
| 4,734,637 A | * | 3/1988 | Chen et al. .................. 324/642 |
| 5,198,807 A | | 3/1993 | Troyk et al. ........... 340/825.54 |
| 5,313,496 A | * | 5/1994 | de Goede .................... 375/342 |
| 5,345,048 A | * | 9/1994 | Towey, Jr. ................... 187/393 |
| 5,469,148 A | | 11/1995 | Baumann et al. ........... 340/658 |
| 5,742,198 A | * | 4/1998 | Horie et al. ................. 327/551 |
| 6,047,023 A | * | 4/2000 | Arnstein ..................... 375/229 |

FOREIGN PATENT DOCUMENTS

| | | | |
|---|---|---|---|
| EP | 0 764 920 | 3/1997 | ............. G06K/7/08 |
| FR | 2 270 592 | 12/1975 | ........... G01R/23/10 |

* cited by examiner

*Primary Examiner*—Michael Horabik
*Assistant Examiner*—Scott Au
(74) *Attorney, Agent, or Firm*—Lisa K. Jorgenson; Allen, Dyer, Doppelt, Milbrath & Gilchrist, P.A.

(57) ABSTRACT

The circuit for detecting the frequency of binary signals includes a circuit for detecting rising edges in the binary signals, a measuring circuit for measuring the period between the rising edges which supplies a logic state, and a shift register whose input latch stores the logic state. Also, the detecting circuit includes a shift circuit for shifting logic states of the shift register, and a decoding circuit for decoding logic states of the register, and which supplies a signal validating the signals. The detecting circuit can be used in contactless chip card readers.

20 Claims, 3 Drawing Sheets

CIRCUIT FOR DETECTING ELECTRICAL SIGNALS AT A GIVEN FREQUENCY

FIELD OF THE INVENTION

The invention relates to circuits for detecting electrical signals having a predetermined frequency.

BACKGROUND OF THE INVENTION

Such detecting circuits are known and can be constructed in analog form or digital form. An analog device uses a filter which is centered at the desired frequency, and the filtered signal is applied to a threshold or level detector circuit. Such an analog device is difficult to produce in the form of an integrated circuit at a reasonable cost.

A digital device implements two different processes, of which the first includes sampling the signal and encoding the sampled amplitudes. In one of the processes, there is then performed a decomposition into a Fourier series to determine whether the frequency of the first harmonic corresponds to the desired frequency. In the other digital process, the codes of the sample are applied to a digital filter centered at the desired frequency.

Such digital devices require the use of signals for sampling and coding which have very high frequencies relative to the desired frequency, leading to integrated circuits operating at high frequencies whose manufacturing costs are correspondingly high. This cost aspect is all the more important when these analog or digital devices are used in readers for contactless IC cards, also known as contactless chip cards.

Indeed, it is more and more common, especially for controlling access to certain areas or sites, to use contactless chip cards which are detected and read at a distance by readers that send radio frequency signals, for example, at a frequency Fo=13.56 MHZ. These signals at the carrier frequency Fo are amplitude modulated by the binary values of the message to be sent to the card, for example at a frequency of around Fm=106 kHz, i.e. $\frac{1}{128}^{th}$ of the frequency Fo.

The signals detected by the card via an antenna are used to provide electrical power to electronic circuits of the card as regards the signals at the carrier frequency. This allows the subsequent detection and interpretation of the modulated signal. In response to these amplitude modulated signals from the reader, the card produces binary signals which modulate the load on the card's antenna such that the reader, which continues to transmit at the carrier frequency Fo, detects this modulation.

In contactless chip cards operating at the carrier frequency of 13.56 MHZ, the card's modulation signal has a frequency Fc=847 KHz approximately, i.e. one sixteenth of the carrier frequency. The binary information is sent by phase changes or jumps according to a key known under the acronym BPSK, for binary phase shift key. More specifically, the signal at frequency Fc changes phase by 180° upon changing a binary digit, from 1 to 0 or from 0 to 1.

The invention more specifically concerns, in a reader for a contactless chip card, a circuit for detecting the presence of a BPSK type signal at the frequency Fc=847 KHz sent by the chip card, this signal being referred to as the "sub-carrier" relative to the signal at frequency Fo which is referred to as the "carrier".

In a chip card reader according to the prior art, as shown in the diagram of FIG. 1, a receiver 10 detects the signal coming from the chip card and delivers a detected signal to an amplifier 12 and a sub-carrier detector 14. The amplified signal is applied to a demodulator 16 which is provided for interpreting a BPSK type coded signal and for outputting the binary digits of the data sent by the chip card. The thus-detected binary numbers are only "validated", or acknowledged, if the sub-carrier detector 14 supplies what is referred to as a "validation" signal indicating that it has recognized the sub-carrier frequency and consequently that the binary data resulting from the demodulation can be taken into consideration.

As indicated above, the sub-carrier detector 14 performs this detection either by pass-band analog filtering followed by a level detection, or by an analog-to-digital conversion followed by digital filtering or a decomposition into a Fourier series, where only the first harmonic is kept.

SUMMARY OF THE INVENTION

An object of the present invention is thus to provide a circuit for detecting the presence of a BPSK type signal at a predetermined frequency without implementing analog or digital filtering, analog-to-digital conversion or a decomposition into a Fourier series.

Another object of the invention is to provide a circuit for detecting the presence of a BPSK type signal at a predetermined frequency by implementing logic circuits which are easy produce in an integrated circuit.

The invention thus relates to a circuit for detecting electrical signals at a predetermined frequency Fc, the electrical signals being binary signals. The detection circuit includes a circuit for detecting rising edges in the binary signals, and supplying a pulse at each rising edge, and a measuring circuit for measuring the period between two pulses, and indicating by a logic state that the period is between a minimum period and a maximum period. The detection circuit also includes a shift register whose input latch memorizes the logic state indicated by the measuring circuit, a shift circuit for shifting logic states of the shift register, and supplying a shift signal D, and a decoding circuit for decoding logic states of the shift register, and supplying a signal indicating whether or not the binary signals have the required frequency.

The measuring circuit preferably includes a counter for counting pulses of a clock signal, and a decoding circuit for decoding count values, which supplies the signal of logic state when the count values are between the minimum and maximum periods between two consecutive pulses.

The shift circuit preferably includes a counter which counts the pulses of the clock signal, and a decoding circuit for decoding a specific count value which is less than the minimum period.

BRIEF DESCRIPTION OF THE DRAWINGS

The invention shall be better understood upon reading the following description of a preferred exemplary embodiment, given in conjunction with the appended drawings.

DETAILED DESCRIPTION OF THE PREFERRED EMBODIMENTS

Figure 1:
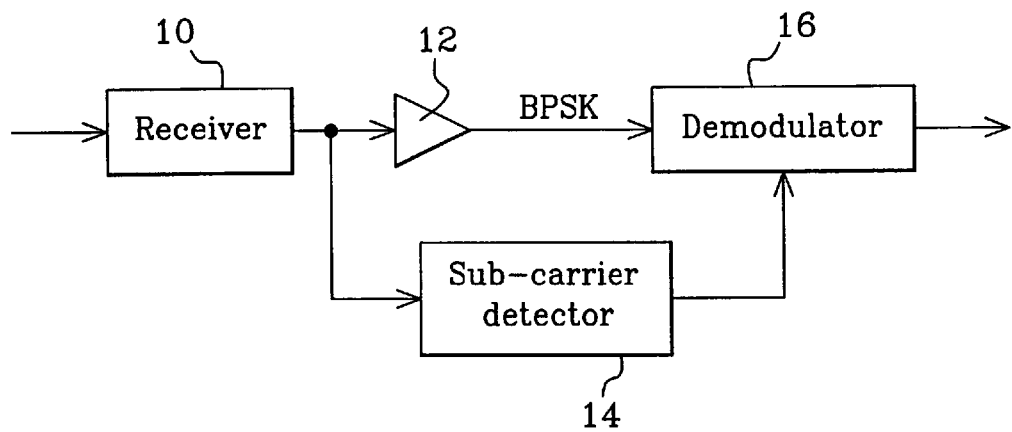
FIG. 1 is a schematic diagram of a part of a contactless chip card reader according to the prior art.
Figure 2:
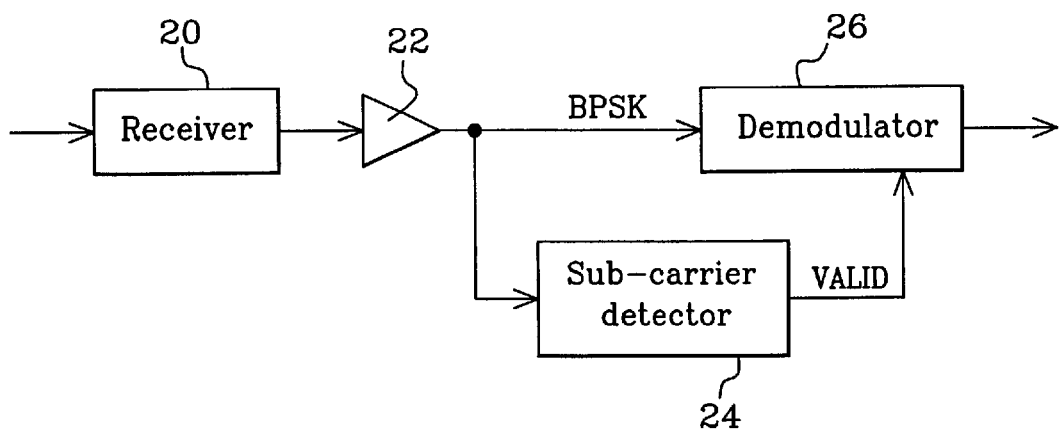
FIG. 2 is a schematic diagram of a part of a contactless chip card reader in which the BPSK signal is detected in accordance with the present invention.

The diagram of FIG. 2 is analogous to that of FIG. 1 inasmuch as it uses a receiver 20, a threshold amplifier 22 and a BPSK demodulator 26 corresponding respectively to elements 10, 12 and 16 of FIG. 1. It differs in that it uses a circuit 24 for detecting the frequency of a BPSK signal which features the characteristics of the present invention and in that this detector circuit receives not the output signal from the receiver 20, but rather the output signal from the threshold amplifier 22. As a result, the signals applied to the demodulator 26 and to the sub-carrier detection circuit 24 are identical.

Figure 4A:
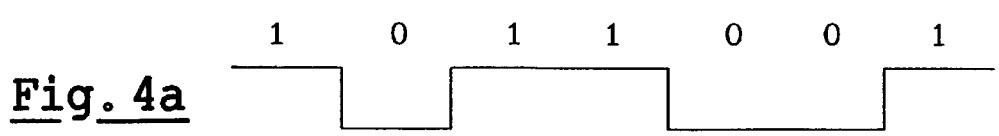
FIGS. 4a, 4b and 4c are signal diagrams.
Figure 4B:
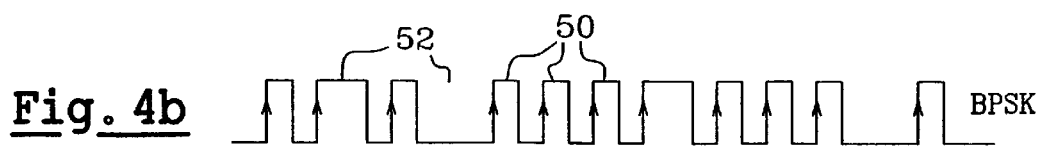

The diagram of FIG. 4a illustrates a succession of binary signals 1, 0, 1, 1, 0, 0, 1 while the diagram of FIG. 4b illustrates the BPSK signal corresponding to that series of binary signals. This signal includes a signal at a frequency of e.g. 847 KHz, which is the sub-carrier of a communications system between a contactless chip card and a reader for such a card. This BPSK signal changes by 180° each time the binary digit changes. It exhibits pulses 50 at the frequency of 847 KHz and pulses 52 at half that frequency, i.e. 423.5 KHz.

Figure 3:
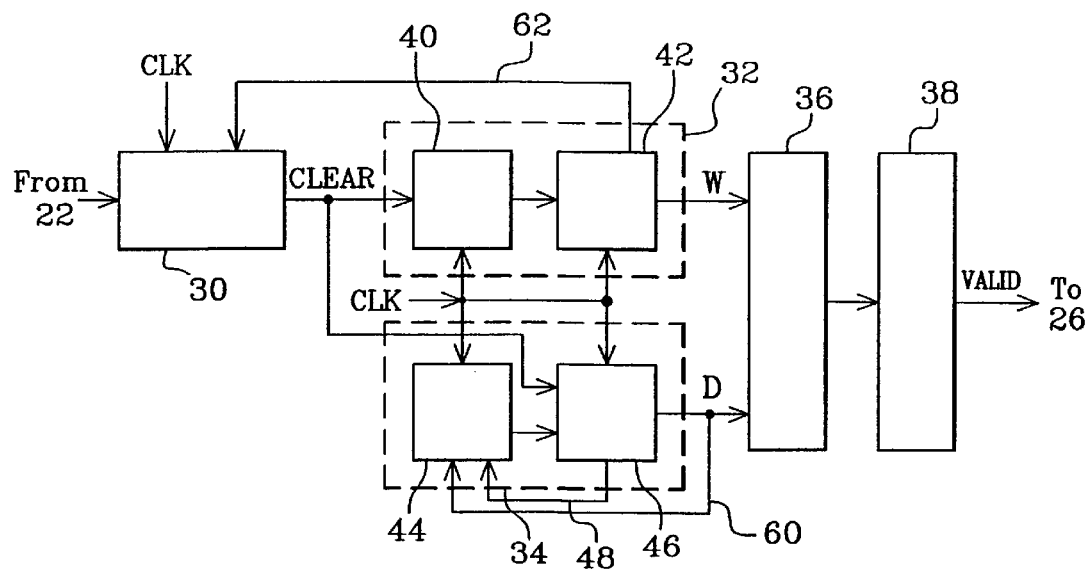
FIG. 3 is block diagram of a circuit for detecting the frequency of a BPSK signal in accordance with the present invention.

As shown in FIG. 3, the device 24 for detecting the frequency of a BPSK signal includes a circuit 30 for detecting rising edges, which supplies a pulse at each rising edge of the BPSK signal (CLEAR signal), and a measuring circuit 32 for measuring the time period between two pulses of the CLEAR signal, which indicates by a logic state W whether the measured time period is between a minimum period Li and a maximum period Ls. The detection device 24 also includes a shift register 36 whose input latch memorizes the logic state W indicated by the measuring circuit 32, a shift control circuit 34 for controlling the shifting of the logic states of the shift register 36, which supplies a shift signal D, and a circuit 38 for decoding the logic states of the shift register 34, which supplies a validation signal VALID indicating whether or not the input signal BPSK is at the required frequency.

The different elements 30, 32 and 34 receive a clock signal CLK whose frequency is e.g. equal to Fo=13.56 MHZ in the case of a chip card reader. The measuring circuit 32 comprises a counting circuit 40 which counts the pulses of the clock signal CLK, and a decoding circuit 42 for decoding the count values of the counter 40 corresponding to the time periods Li and Ls, as well as an overstep signal "DEP".

Figure 5:
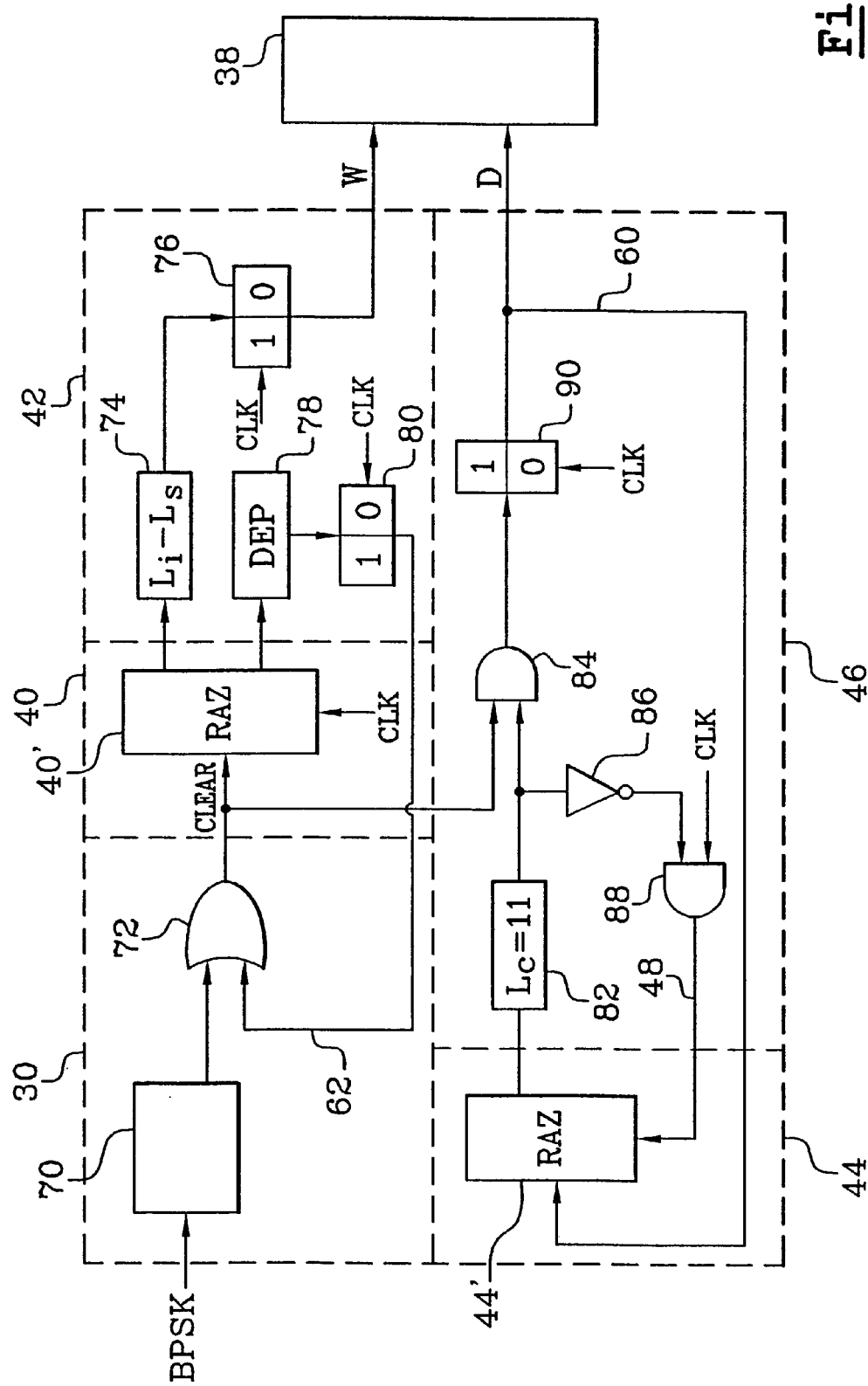
FIG. 5 is a more detailed schematic diagram illustrating the circuit of FIG. 3.
Figure 1:
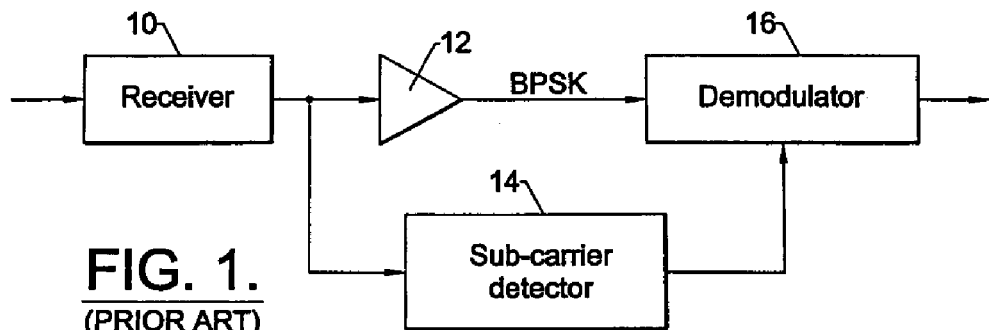
Figure 2:
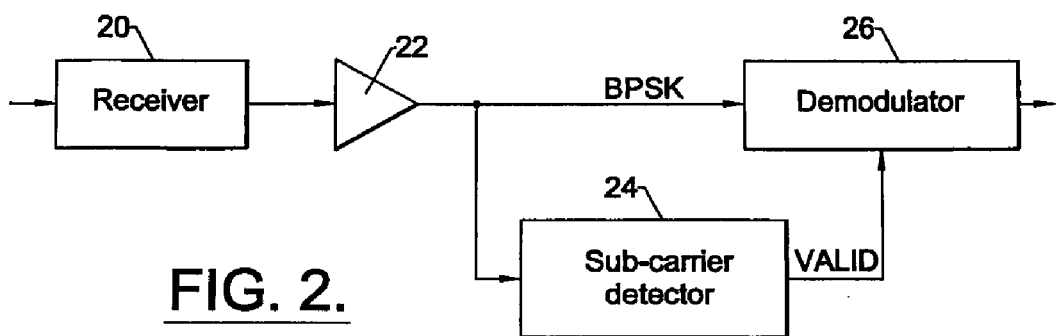
Figure 3:
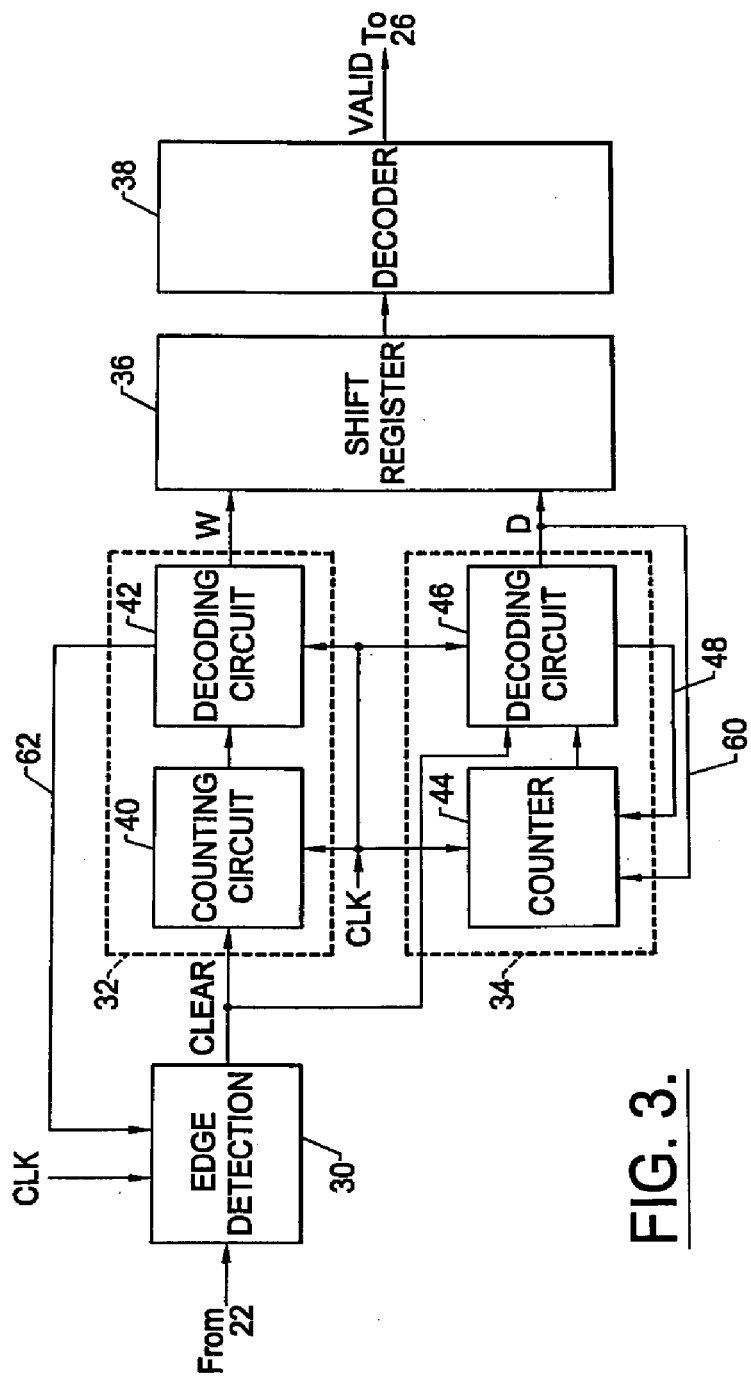
Figure 4A:
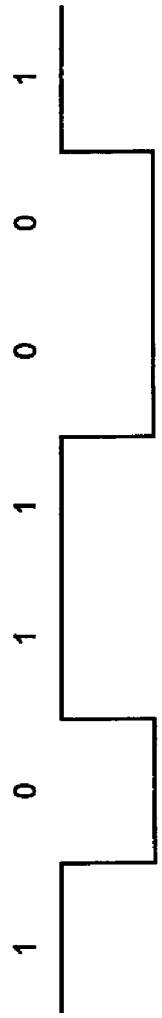
Figure 4B:
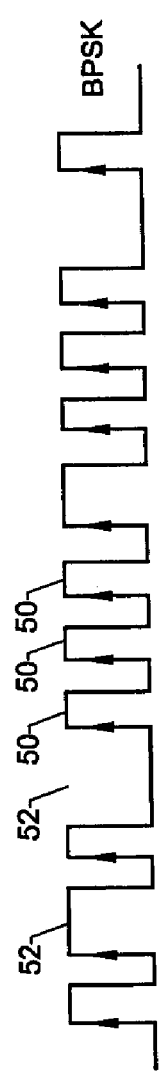
Figure 4C:
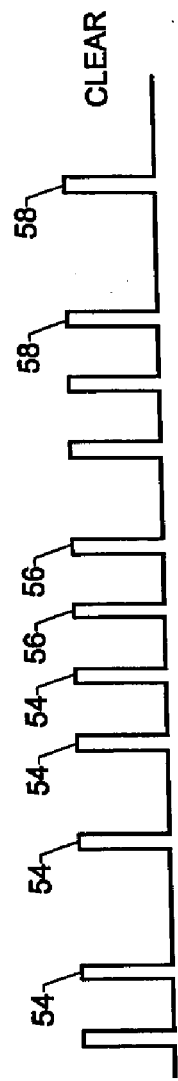
Figure 5:
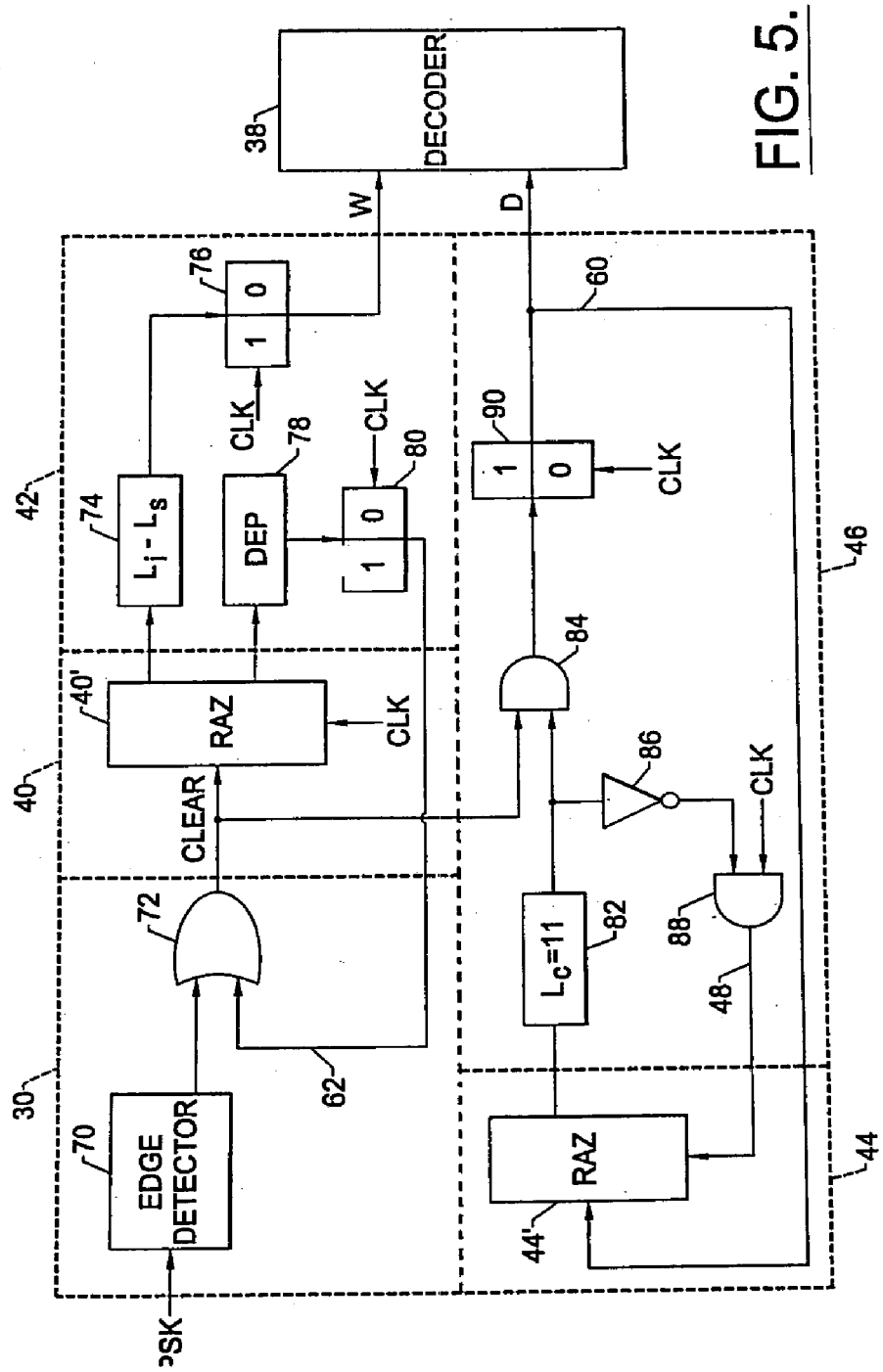
Figure 1:
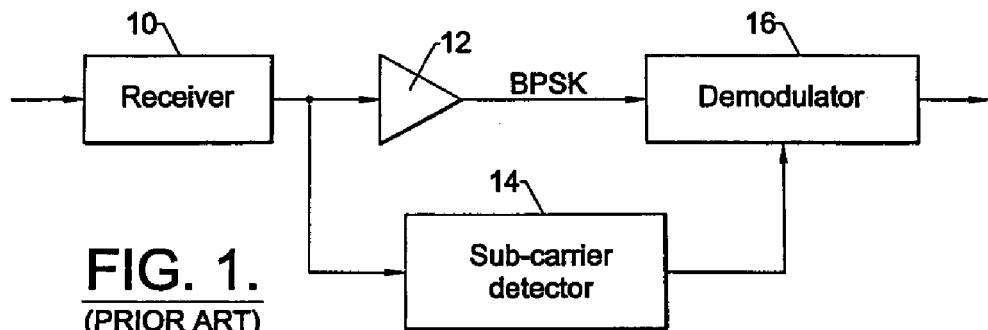
Figure 2:
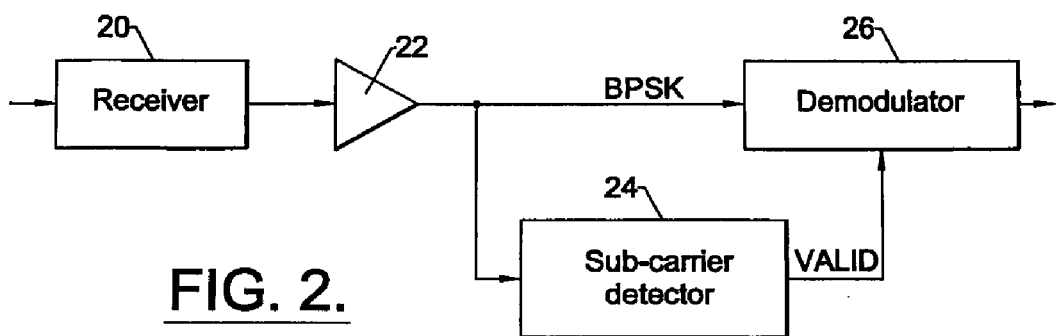
Figure 3:
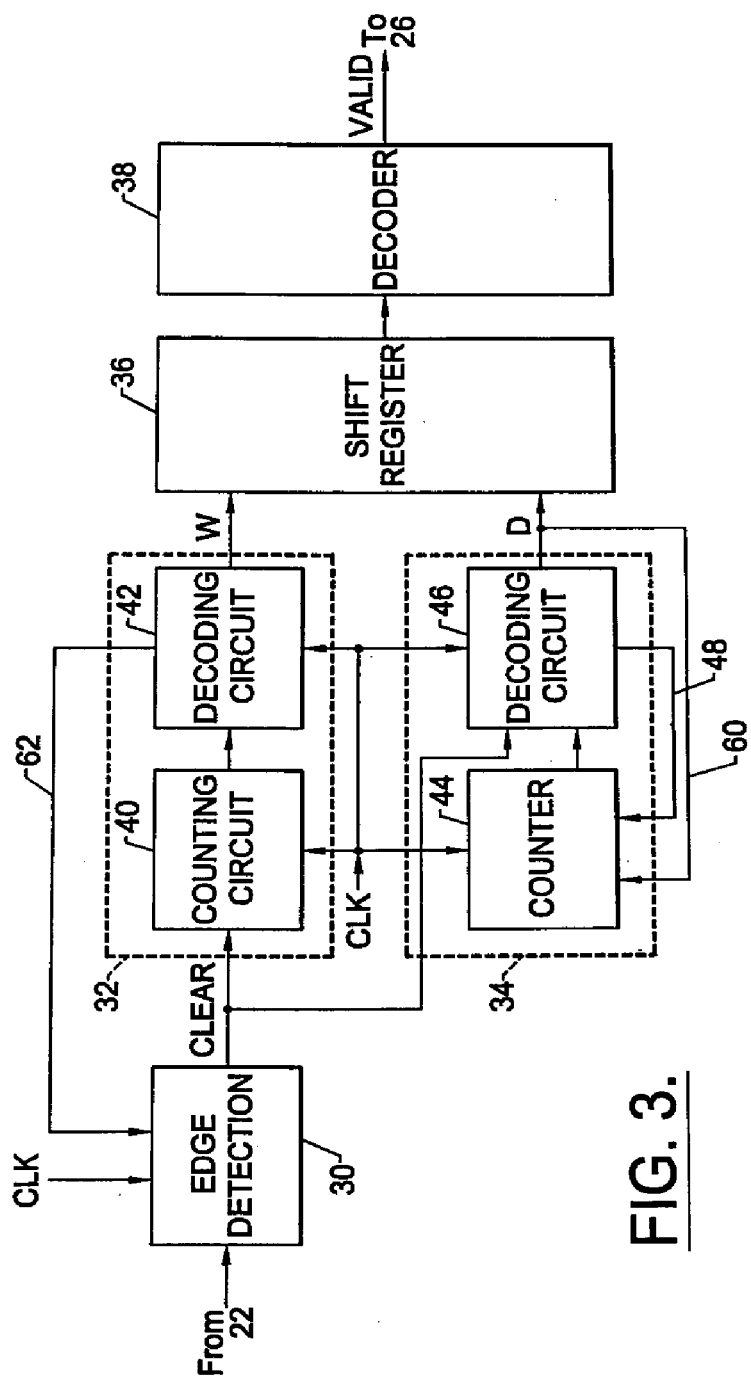
Figures 4A, 4B, 4C:
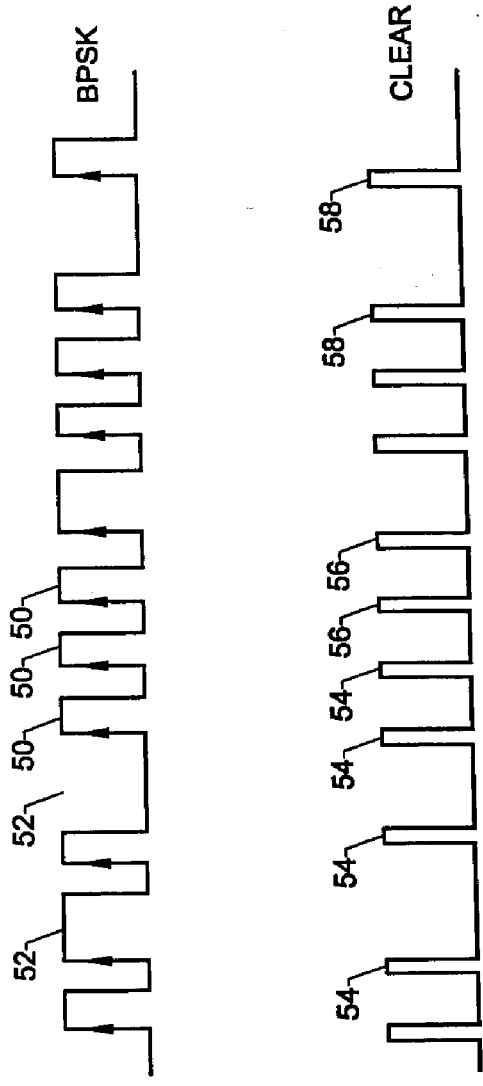
Figure 5:
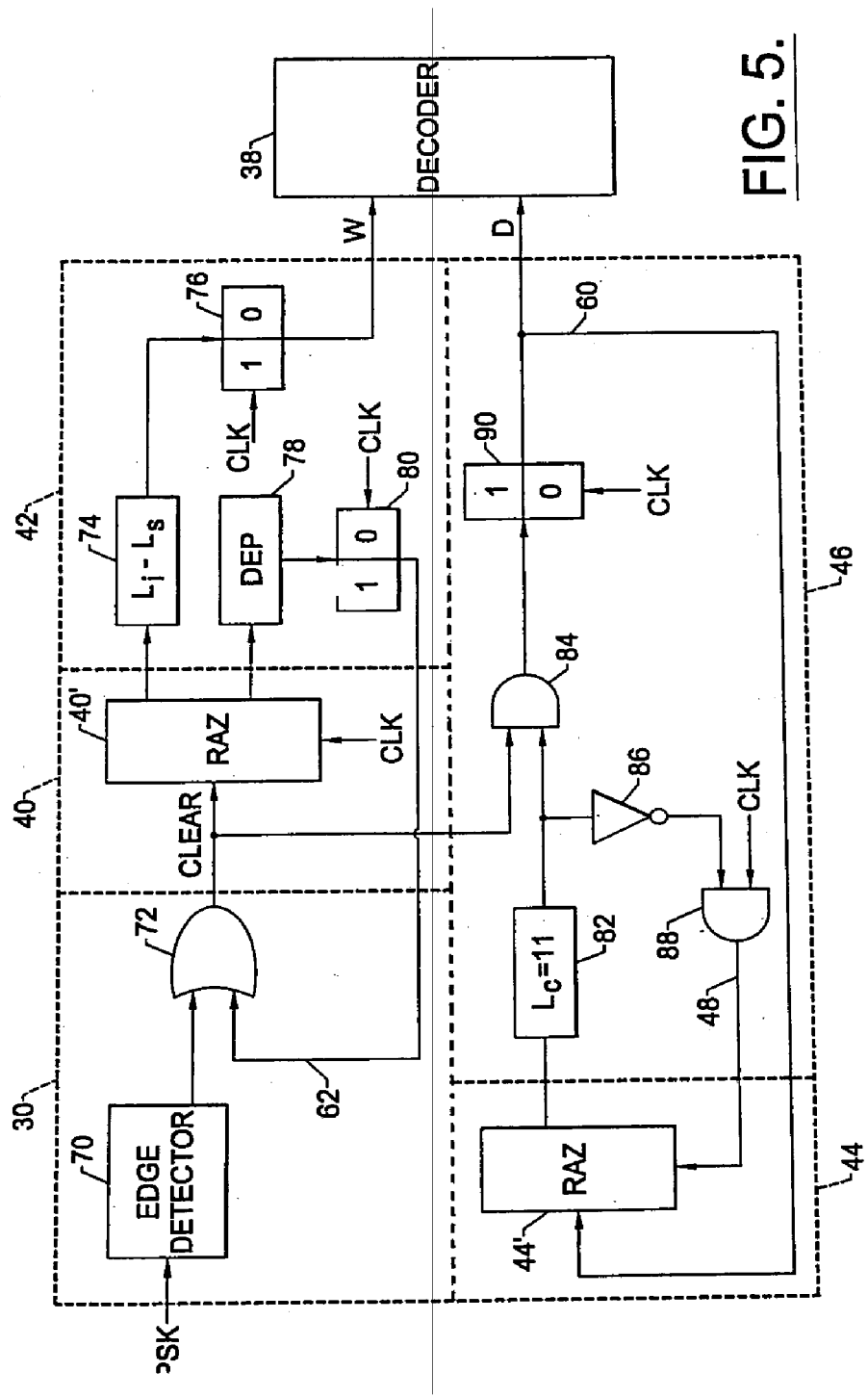

More specifically, as shown in FIG. 5, the counting circuit 40 comprises a counter 40' having a reset-to-zero input terminal RAZ at which are applied the pulses of the CLEAR signal and an input terminal for the clock signal CLK. Some output terminals of the counter 40' are connected to a decoder 74 which detects the count values within the time periods Li and Ls. Other output terminals are connected to a decoder 78 which detects a count overstep value DEP. The output terminal of the decoder 74 is connected to the control input terminal of a latch 76 whose other input terminal receives the clock signal CLK. Signal W is supplied by an output terminal of the latch 76.

Figure 4C:
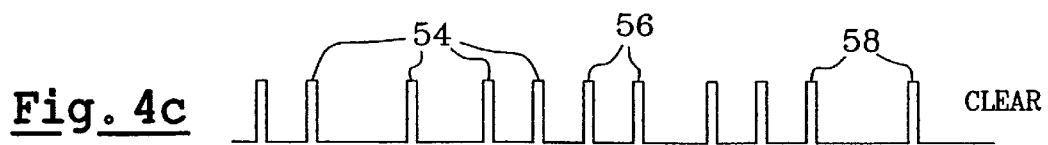

The output terminal of the decoder 78 is connected to a control input terminal of a latch 80 whose other input terminal receives the clock signal CLK. The signal supplied by an output terminal of the latch 80 is applied via a conductor 62 to an input terminal of an OR logic circuit referenced 72. The other input terminal of the logic circuit 72 receives the pulses representative of the rising edges of the signal BPSK, these rising edges being detected by a circuit 70. In other words, the pulses of the CLEAR signal are made up of pulses 54 (FIG. 4c) representative of the rising edges of signal BPSK and of pulses representative of a count value DEP of the counter 40'.

The shift control circuit 34 comprises a counter 44 which counts the pulses of the clock signal CLK and a decoder circuit 46 for decoding a certain value Lc of the counter corresponding to the shift signal D.

More specifically, as shown in FIG. 5, the counter 44 or 44' has a reset-to-zero input terminal RAZ to which is applied the shift signal D via a conductor 60, and an input terminal for the clock signal CLK. Some output terminals of the counter 44 or 44' are connected to a decoder 82 which detects the count value "Lc" taken to be equal to "ELEVEN", as explained below. The output terminal of the decoder 82 is connected directly to an input terminal of a first AND logic circuit referenced 84 and to an input terminal of a second AND logic circuit referenced 88, via an inverter circuit 86.

The second input terminal of logic circuit 84 is connected to the output terminal of logic circuit 72, and thus receives the CLEAR signal. The output terminal of logic circuit 84 is connected to a control input of a latch 90 having another input terminal which receives the clock signal CLK. An output terminal of latch 90 supplies a shift signal D which is applied to the shift register 38 and to the reset-to-zero terminal RAZ of counter 44 or 44'.

The second logic circuit 88 has a second input terminal which receives the clock signal CLK and an output terminal which is connected to the input terminal of the clock terminal CLK by a conductor 48. The device according to the diagrams of FIGS. 3 and 5 detects a signal at the 847 KHz frequency by measuring the time periods of the signals supplied by the amplifier 22 (FIG. 2). If the time period is between time periods Li and Ls (signal W), then a logic 1 state is stored in the shift register 36. If their time period is outside these limits, a logic 0 state is stored in the shift register 36.

These logic states 1 or 0 are stored and shifted each time the shift signal D appears. When the number of logic 1 states contained in the shift register is greater than a certain value, it is considered that the signal supplied by the amplifier 22 and hence the receiver 20 is at the frequency of 847 KHz.

According to the invention, the BPSK signal (FIG. 4b) is applied to circuit 30 which detects the leading edges (with the upwardly pointing arrows) and supplies pulses 54 that constitute the CLEAR signal. What counter 40, 40' measures are the time intervals between the pulses 54, by counting the number of clock pulses CLK, whose frequency is sixteen times greater than that of the BPSK signal (ratio of 13.56 MHZ/847 KHz). The values Li, Ls, Lc and DEP are thus expressed in terms of the number of pulses of the clock signal CLK.

In principle, the time interval between two consecutive pulses 56 (without a phase change) is of sixteen clock pulses CLK, and is of twenty four clock pulses CLK between two consecutive pulses 58 (with a phase change), i.e. Ls=23. In practice, however, the pulses 54, 56 and 58 are not stable, and this must be taken into account by considering that the minimum time interval can be less than sixteen, e.g. equal to twelve, giving Li=12.

The pulses of the CLEAR signal reset the counter 40 to zero, so that the number displayed by the counter is a measure of the time elapsed starting from the instant the CLEAR signal pulse appears. When counter 44 reaches the value (Lc=11), the latter is detected by the decoding circuit 82 which supplies the shift signal D for shifting the shift register 38 upon the arrival of the following CLEAR pulse, via circuits 84 and 90. This pulse determines the end of the time interval to measure. Also, the decoding of this value (Lc=11) allows to block the count by counter 44 by a signal on conductor 48 via circuits 86 and 88, whereupon counter 44 remains at that value.

The following clock pulse CLK causes counter 40 to pass on to position "TWELVE" (Li=12). This value is detected by the decoding circuit 74, which supplies a signal W, referred to as an envelope or window, for passing the first latch of the shift register 36 to logic state 1. This logic state 1 shall then be shifted to the following latch when the shift signal D appears, owing to the CLEAR pulse which determines the end of the time interval to measure. As a result, counters 40 and 44 are reset to zero each time a CLEAR signal pulse appears, so that the two counters operate normally in synchronism.

Signal W remains at logic 1 all the while counter 40 is between 12 (Li=12) and 23 (Ls=23) in the absence of the following CLEAR pulse. As soon as the latter appears, counter 40 is reset to logic 0, so that signal W returns to logic 0 while signal D causes the logic 1 in the shift register 36 to shift, and resets counter 44 to logic 0, through a conductor 60. If counter 40 reaches position "24" (DEP=24) before the following CLEAR pulse appears, the signal for decoding this position (decoder 78) resets counter 40 to zero through a signal on a conductor 62 via circuit 80.

If this normal operation becomes established, the latches, which may be e.g. eight in number, of shift register 36 all pass to logic 1, which signifies that the BPSK signal is at the required frequency, i.e. 847 KHz. The logic state 1 of all the latches is detected by a decoding circuit 38 which supplies a validation signal VALID applied to the demodulator 26 (FIG. 2). Because of instabilities affecting the signals received by the reader, it is not realistic to expect to obtain and maintain a logic 1 state in all the latches of register 36. Accordingly, the invention provides for the VALID signal to appear when a certain number of the eight latches, for instance five, are at logic 1.

In the case where the BPSK signal's sub-carrier frequency is greater than 847 KHz, the CLEAR signal pulse shall appear before the counter 40 has reached the value "TWELVE", so that signal W shall remain at logic 0, that logic state 0 being sent to the first latch of the shift register 36 and being shifted to the next latch by the shift signal D appearing at the moment of the next pulse of the CLEAR signal. After a certain time, the number of 1 states in the shift register 36 falls to less than five, and the VALID signal disappears, so prohibiting taking into account the output of the demodulator 26.

In the case where there is no sub-carrier, counter 40 counts up to the value "24" since the following pulse of the CLEAR signal does not appear (absence of sub-carrier). The decoding circuit 78 detects this value "24" and supplies an overstep signal which resets counter 40 to zero by the conductor 62. Also, signal W, which had passed to logic state 1 between the values 12 to 23, returns to logic state 0, and this state is applied to the first latch of the shift register 36. Similarly, counter 44 has counted up to the value 11 and remains blocked at that value.

The shift signal D only appears when the overstep signal (DEP=24) is detected via the circuits 78, 80, 72, 84 and 90, and has for effect to shift the 0 state of signal W of the first latch to the second latch of shift register 36, and of resetting counter 44, 44' to zero. After a certain time, the number of 1 logic states in shift register 36 becomes less than five and the VALID signal disappears, so prohibiting taking into account the output of the demodulator 26.

In the case where the frequency of the sub-carrier is much less than 847 KHz and has a value such that counter 40 reaches the value "24" before the following CLEAR signal appears, the operation is similar to that in the case described above of the absence of a sub-carrier. However, owing to the presence of pulses in the CLEAR signal corresponding to rising edges, the first pulse of the CLEAR signal appearing after resetting to zero counter 40 by the overstep signal shall set counter 40 to zero before it reaches the value "12", so that signal W remains at 0. All the while counter 44, 44' does not reach the value "11", the shift signal D shall not appear for shifting the states of the latches and for resetting counter 44 to zero. This counter 44 shall continue to count from the value reached whilst counter 40 starts again from the value "0".

There results a shift between the simultaneous values of the two counters 40 and 44, counter 44 being at a higher value so that the value "ELEVEN" is reached and allows the shift signal D to appear several periods of the clock signal CLK before counter 40 reaches the value "12". Under these conditions, if the following pulse of the CLEAR signal appears before counter 40 reaches the value "12", the signal W shall be at logic state 0 and this 0 state shall be written into the first latch and then shifted into the second latch by the shift signal D, which corresponds to the frequency of the sub-carrier not being recognized.

On the other hand, if the following pulse of the CLEAR signal appears after the counter 40 has reached the value "12", signal W shall pass to logic 1, corresponding to the sub-carrier frequency being recognized. In the case where the sub-carrier is much greater than 847 KhZ, counter 40, 40' shall never reach the value "12", so that signal W shall remain at logic state 0. On the other hand, counter 44, 44' shall reach the value "11" in a systematic way, so that the signal D shall appear during the following CLEAR pulse and shall shift the 0 state of signal W in the register 36. As soon as the number of 0 states of the shift register 38 is greater than three, the VALID signal does not appear, which signifies that the sub-carrier has not been recognized.

The invention has been described in connection with a specific embodiment, in particular with BPSK signals and determined frequency values. However, the invention can be implemented for other frequencies and also using different values for Li, Ls, Lc, and DEP. Moreover, the invention is applicable to signals other than those of the BPSK type.

That which is claimed is:

1. A circuit for detecting whether electrical received binary signal are at a predetermined frequency, the circuit comprising:

a detecting circuit for detecting rising edges in the binary signals and generating a clear signal at each rising edge;

a measuring circuit for measuring a period between consecutive pulses of the clear signal, and indicating by a logic state that the period is between a minimun period and a maximum period;

a shift register having an input latch for storing the logic state from the measuring circuit;

a shift circuit for supplying a shift signal to shift logic states of the shift register; and a decoding circuit for decoding logic states of the shift register and supplying a detection signal indicating whether or not the binary signals have the predetermined frequency.

2. A circuit according to claim 1, wherein the measuring circuit comprises:
   a first counter for counting clock signal pulses between consecutive pulses of the clear signal which resets the first counter to zero; and
   a first decoding circuit for decoding count values, supplying the logic state signal when the count values are between the minimum period and the maximum period between consecutive pulses of the clear signal, and for supplying an overstep signal indicating a counting period has been exceeded which resets the first counter to zero.

3. A circuit according to claim 2 wherein the shift circuit for shifting the logic states of the shift register comprises:
   a second counter for counting clock signal pulses between consecutive pulses of the shift signal; and
   a second decoding circuit for decoding a count value which is less than the minimum period to authorize the shift signal when the count value is reached.

4. A circuit according to claim 3, wherein the first decoding circuit comprises:
   a first decoder for decoding count values between the minimum period and the maximum period;
   a first latch for storing an output of the first decoder to supply the logic state;
   a second decoder for decoding the overstep signal, and
   a second latch for storing an output of the second decoder to supply a reset to zero signal for the first counter.

5. A circuit according to claim 4 wherein the second decoding circuit comprises:
   a third decoder for decoding the count value;
   a first logic circuit for blocking a counting operation of the second counter upon decoding the count value; and
   a second logic circuit for supplying the shift signal upon decoding the count value.

6. A circuit for detecting a frequency of Binary Phase Shift Keyed (BPSK) signal comprising:
   a detecting circuit for detecting rising edges in the BPSK signal and generating a clear signal at each rising edge;
   a measuring circuit for measuring a period of the clear signal and indicating whether the period is between a minimum period and a maximum period by outputting a logic state;
   a shift register having an input latch for storing the logic state from the measuring circuit;
   a shift circuit for supplying a shift signal to shift logic states of the shift register; and
   a decoding circuit for decoding logic states of the shift register and supplying a detection signal indicating whether the frequency of the BPSK signal corresponds to a predetermined frequency.

7. A circuit according to claim 6, wherein the measuring circuit comprises:
   a first counter for counting clock signal pulses between consecutive pulses of the clear signal which resets the first counter to zero; and
   a first decoding circuit for decoding count values, supplying the logic state signal when the count values are between the minimum period and the maximum period between consecutive pulses of the clear signal, and for supplying an overstep signal indicating a counting period has been exceeded which resets the first counter to zero.

8. A circuit according to claim 7 wherein the shift circuit for shifting the logic states of the shift register comprises:
   a second counter for counting clock signal pulses between consecutive pulses of the shift signal; and
   a second decoding circuit for decoding a count value which is less than the minimum period to authorize the shift signal when the count value is reached.

9. A circuit according to claim 8, wherein the first decoding circuit comprises:
   a first decoder for decoding count values between the minimum period and the maximum period;
   a first latch for storing an output of the first decoder to supply the logic state;
   a second decoder for decoding the overstep signal, and
   a second latch for storing an output of the second decoder to supply a reset to zero signal for the first counter.

10. A circuit according to claim 9 wherein the second decoding circuit comprises:
    a third decoder for decoding the count value;
    a first logic circuit for blocking a counting operation of the second counter upon decoding the count value; and
    a second logic circuit for supplying the shift signal upon decoding the count value.

11. A contactless chip card reader comprising:
    a receiver for receiving a Binary Phase Shift Keyed (BPSK) signal from a contactless chip card and generating a detected signal;
    an amplifier for amplifying the detected signal and generating an amplified detected signal;
    a demodulator for demodulating the amplified detected signal; and
    a sub-carrier detector circuit for detecting a frequency of the amplified detected signal and generating a validation signal for the demodulator, the sub-carrier detector circuit comprising
    a detecting circuit for detecting rising edges in the amplified detected signal and generating a clear signal at each rising edge,
    a measuring circuit for measuring a period of the clear signal and indicating whether the period is between a minimum period and a maximum period by outputting a logic state,
    a shift register having an input latch for storing the logic state from the measuring circuit,
    a shift circuit for supplying a shift signal to shift logic states of the shift register, and
    a decoding circuit for decoding logic states of the shift register and supplying the validation signal indicating whether the frequency of the amplified detected signal corresponds to a predetermined frequency.

12. A reader according to claim 11, wherein the measuring circuit comprises:
    a first counter for counting clock signal pulses between consecutive pulses of the clear signal which resets the first counter to zero; and
    a first decoding circuit for decoding count values, supplying the logic state signal when the count values are between the minimum period and the maximum period between consecutive pulses of the clear signal, and for supplying an overstep signal indicating a counting period has been exceeded which resets the first counter to zero.

13. A reader according to claim 12 wherein the shift circuit for shifting the logic states of the shift register comprises:

a second counter for counting clock signal pulses between consecutive pulses of the shift signal; and a second decoding circuit for decoding a count value which is less than the minimum period to authorize the shift signal when the count value is reached.

14. A reader according to claim 13, wherein the first decoding circuit comprises:

a first decoder for decoding count values between the minimum period and the maximum period;

a first latch for storing an output of the first decoder to supply the logic state;

a second decoder for decoding the overstep signal, and a second latch for storing an output of the second decoder to supply a reset to zero signal for the first counter.

15. A reader according to claim 14 wherein the second decoding circuit comprises:

a third decoder for decoding the count value;

a first logic circuit for blocking a counting operation of the second counter upon decoding the count value; and a second logic circuit for supplying the shift signal upon decoding the count value.

16. A method for detecting a frequency of Binary Phase Shift Keyed (BPSK) signal comprising:

detecting rising edges in the BPSK signal and generating a clear signal at each rising edge;

measuring a period of the clear signal and indicating whether the period is between a minimum period and a maximum period via a logic state;

storing the logic state in a shift register;

supplying a shift signal to shift logic states of the shift register; and decoding logic states of the shift register and supplying a detection signal indicating whether the frequency of the BPSK signal corresponds to a predetermined frequency.

17. A method according to claim 16, wherein measuring comprises:

counting clock signal pulses between consecutive pulses of the clear signal;

decoding count values;

supplying the logic state signal when the count values are between the minimum period and the maximum period between consecutive pulses of the clear signal; and supplying an overstep signal indicating a counting period has been exceeded which resets the first counter to zero.

18. A method according to claim 17 wherein shifting the logic states of the shift register comprises:

counting clock signal pulses between consecutive pulses of the shift signal; and decoding a count value which is less than the minimum period to authorize the shift signal when the count value is reached.

19. A method according to claim 18, wherein decoding count values comprises:

decoding count values between the minimum period and the maximum period;

supplying the logic state based upon the decoded count values;

decoding the overstep signal; and supplying a reset to zero signal based upon the decoded overstep signal.

20. A method according to claim 19 wherein decoding the count value comprises:

decoding the count value;

blocking the counting of clock signal pulses between consecutive pulses of the shift signal upon decoding the count value; and supplying the shift signal upon decoding the count value.

* * * * *

UNITED STATES PATENT AND TRADEMARK OFFICE
CERTIFICATE OF CORRECTION

PATENT NO. : 6,759,941 B2
DATED : July 6, 2004
INVENTOR(S) : Kari et al.

It is certified that error appears in the above-identified patent and that said Letters Patent is hereby corrected as shown below:

Delete drawing sheets 1-4, and substitute therefore drawing sheets 1-4. (Attached)

Title page illustrating a drawing figure should be deleted, and substitute therefor a title page illustrating a figure as shown on the attached sheet.

Signed and Sealed this

Fourth Day of January, 2005

JON W. DUDAS
*Director of the United States Patent and Trademark Office*

(12) United States Patent
Kari et al.

(10) Patent No.: US 6,759,941 B2
(45) Date of Patent: Jul. 6, 2004

(54) CIRCUIT FOR DETECTING ELECTRICAL SIGNALS AT A GIVEN FREQUENCY

(75) Inventors: Ahmed Kari, Aix-en-Provence (FR); Michel Bardouillet, Rousset (FR)

(73) Assignee: STMicroelectronics SA, Montrouge (FR)

(*) Notice: Subject to any disclaimer, the term of this patent is extended or adjusted under 35 U.S.C. 154(b) by 496 days.

(21) Appl. No.: 09/837,629

(22) Filed: Apr. 18, 2001

(65) Prior Publication Data

US 2001/0038341 A1 Nov. 8, 2001

(30) Foreign Application Priority Data

Apr. 20, 2000 (FR) .................................. 00 05105

(51) Int. Cl.[7] .................. G05B 19/00; G06F 7/00; G08B 29/00; H03D 1/00; H04L 27/06
(52) U.S. Cl. .................................. 340/5.6; 375/340
(58) Field of Search .................. 340/5.6; 375/340, 375/326, 316, 279

(56) References Cited

U.S. PATENT DOCUMENTS

| | | | |
|---|---|---|---|
| 3,737,789 A | 6/1973 | McCoy et al. | 328/138 |
| 3,774,114 A * | 11/1973 | Dahlgren | 340/7.33 |
| 4,442,500 A | 4/1984 | Kongable et al. | 364/724 |
| 4,596,981 A * | 6/1986 | Ueno et al. | 340/825.2 |
| 4,734,637 A * | 3/1988 | Chen et al. | 324/642 |
| 5,198,807 A | 3/1993 | Troyk et al. | 340/825.54 |
| 5,313,496 A * | 5/1994 | de Goede | 375/342 |
| 5,345,048 A * | 9/1994 | Towey, Jr. | 187/393 |
| 5,469,148 A | 11/1995 | Baumann et al. | 340/658 |
| 5,742,198 A * | 4/1998 | Horie et al. | 327/551 |
| 6,047,023 A * | 4/2000 | Arnstein | 375/229 |

FOREIGN PATENT DOCUMENTS

| | | | |
|---|---|---|---|
| EP | 0 764 920 | 3/1997 | G06K/7/08 |
| FR | 2 270 592 | 12/1975 | G01R/23/10 |

\* cited by examiner

*Primary Examiner*—Michael Horabik
*Assistant Examiner*—Scott Au
(74) *Attorney, Agent, or Firm*—Lisa K. Jorgenson; Allen, Dyer, Doppelt, Milbrath & Gilchrist, P.A.

(57) ABSTRACT

The circuit for detecting the frequency of binary signals includes a circuit for detecting rising edges in the binary signals, a measuring circuit for measuring the period between the rising edges which supplies a logic state, and a shift register whose input latch stores the logic state. Also, the detecting circuit includes a shift circuit for shifting logic states of the shift register, and a decoding circuit for decoding logic states of the register, and which supplies a signal validating the signals. The detecting circuit can be used in contactless chip card readers.

20 Claims, 3 Drawing Sheets

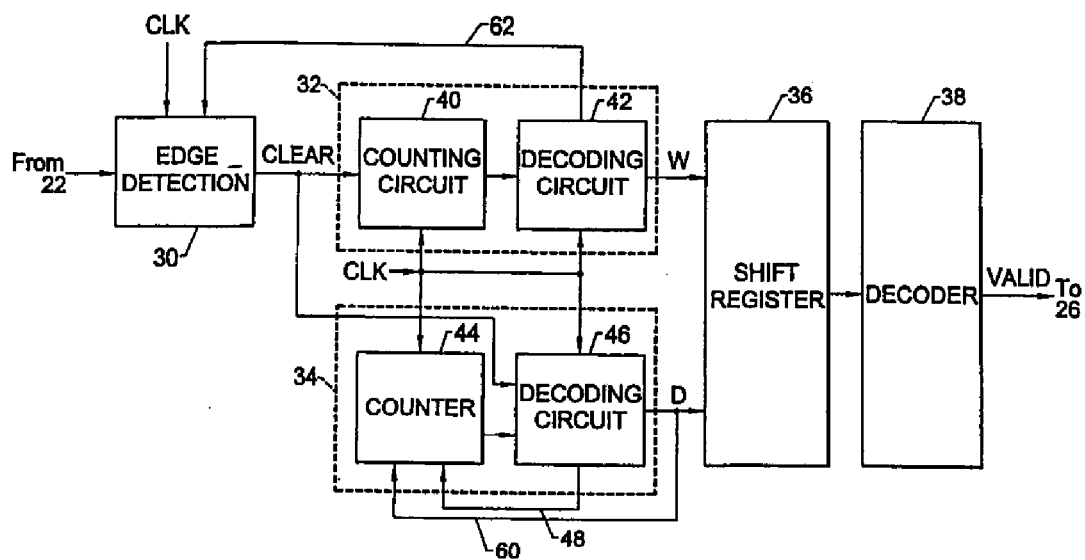

UNITED STATES PATENT AND TRADEMARK OFFICE
CERTIFICATE OF CORRECTION

PATENT NO. : 6,759,941 B2
DATED : July 6, 2004
INVENTOR(S) : Kari et al.

It is certified that error appears in the above-identified patent and that said Letters Patent is hereby corrected as shown below:

Delete drawing sheets 1-4, and substitute therefore drawing sheets 1-4. (Attached)

Title page illustrating a drawing figure should be deleted, and substitute therefor a title page illustrating a figure as shown on the attached sheet.

Column 6,
Line 50, delete "binary signal" and insert -- binary signals --.
Line 57, delete "minimun" and insert -- minimum --.

This certificate supersedes Certificate of Correction issued January 4, 2005.

Signed and Sealed this

Tenth Day of May, 2005

JON W. DUDAS
*Director of the United States Patent and Trademark Office*

United States Patent
Kari et al.

(10) Patent No.: US 6,759,941 B2
(45) Date of Patent: Jul. 6, 2004

(54) CIRCUIT FOR DETECTING ELECTRICAL SIGNALS AT A GIVEN FREQUENCY

(75) Inventors: Ahmed Kari, Aix-en-Provence (FR); Michel Bardouillet, Rousset (FR)

(73) Assignee: STMicroelectronics SA, Montrouge (FR)

(*) Notice: Subject to any disclaimer, the term of this patent is extended or adjusted under 35 U.S.C. 154(b) by 496 days.

(21) Appl. No.: 09/837,629

(22) Filed: Apr. 18, 2001

(65) Prior Publication Data

US 2001/0038341 A1 Nov. 8, 2001

(30) Foreign Application Priority Data

Apr. 20, 2000 (FR) .............................. 00 05105

(51) Int. Cl.[7] .......................... G05B 19/00; G06F 7/00; G08B 29/00; H03D 1/00; H04L 27/06
(52) U.S. Cl. ................................ 340/5.6; 375/340
(58) Field of Search ........................ 340/5.6; 375/340, 375/326, 316, 279

(56) References Cited

U.S. PATENT DOCUMENTS

| | | | |
|---|---|---|---|
| 3,737,789 A | 6/1973 | McCoy et al. | 328/138 |
| 3,774,114 A * | 11/1973 | Dahlgren | 340/7.33 |
| 4,442,500 A | 4/1984 | Kongable et al. | 364/724 |
| 4,596,981 A * | 6/1986 | Ueno et al. | 340/825.2 |
| 4,734,637 A * | 3/1988 | Chen et al. | 324/642 |
| 5,198,807 A | 3/1993 | Troyk et al. | 340/825.54 |
| 5,313,496 A * | 5/1994 | de Goede | 375/342 |
| 5,345,048 A * | 9/1994 | Towey, Jr. | 187/393 |
| 5,469,148 A | 11/1995 | Baumann et al. | 340/658 |
| 5,742,198 A * | 4/1998 | Horie et al. | 327/551 |
| 6,047,023 A * | 4/2000 | Arnstein | 375/229 |

FOREIGN PATENT DOCUMENTS

| | | | |
|---|---|---|---|
| EP | 0 764 920 | 3/1997 | G06K/7/08 |
| FR | 2 270 592 | 12/1975 | G01R/23/10 |

* cited by examiner

*Primary Examiner*—Michael Horabik
*Assistant Examiner*—Scott Au
(74) *Attorney, Agent, or Firm*—Lisa K. Jorgenson; Allen, Dyer, Doppelt, Milbrath & Gilchrist, P.A.

(57) ABSTRACT

The circuit for detecting the frequency of binary signals includes a circuit for detecting rising edges in the binary signals, a measuring circuit for measuring the period between the rising edges which supplies a logic state, and a shift register whose input latch stores the logic state. Also, the detecting circuit includes a shift circuit for shifting logic states of the shift register, and a decoding circuit for decoding logic states of the register, and which supplies a signal validating the signals. The detecting circuit can be used in contactless chip card readers.

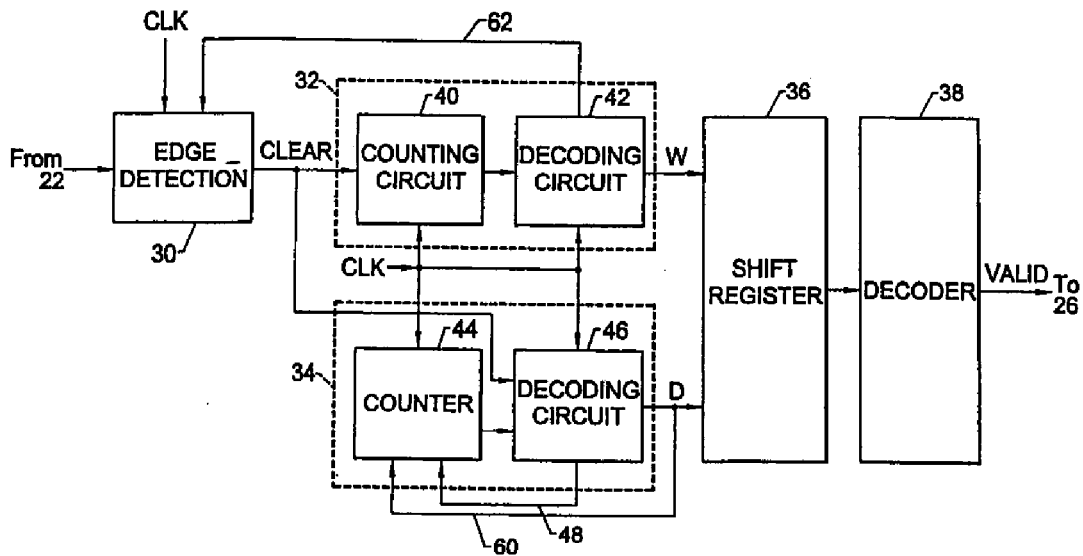

20 Claims, 3 Drawing Sheets